(12) United States Patent
Shea et al.

(10) Patent No.: US 8,846,542 B2
(45) Date of Patent: Sep. 30, 2014

(54) METHODS FOR FORMING SEMICONDUCTOR CONSTRUCTIONS, AND METHODS FOR SELECTIVELY ETCHING SILICON NITRIDE RELATIVE TO CONDUCTIVE MATERIAL

(71) Applicant: Micron Technology, Inc., Boise, ID (US)

(72) Inventors: Kevin R. Shea, Boise, ID (US); Thomas M. Graettinger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/180,197

(22) Filed: Feb. 13, 2014

(65) Prior Publication Data
US 2014/0162430 A1   Jun. 12, 2014

Related U.S. Application Data

(62) Division of application No. 13/904,828, filed on May 29, 2013, now Pat. No. 8,691,704, which is a division of application No. 13/288,715, filed on Nov. 3, 2011, now Pat. No. 8,470,716, which is a division of application No. 12/652,955, filed on Jan. 6, 2010, now Pat. No. 8,076,248, which is a division of application No. 11/506,347, filed on Aug. 17, 2006, now Pat. No. 7,666,797.

(51) Int. Cl.
| | | |
|---|---|---|
| *H01L 21/302* | (2006.01) | |
| *H01L 21/316* | (2006.01) | |
| *H01L 21/318* | (2006.01) | |
| *H01L 49/02* | (2006.01) | |
| *H01L 21/311* | (2006.01) | |
| *H01L 21/3213* | (2006.01) | |
| *H01L 21/306* | (2006.01) | |
| *H01L 27/108* | (2006.01) | |
| *H01L 27/105* | (2006.01) | |

(52) U.S. Cl.
CPC .......... *H01L 28/92* (2013.01); *H01L 21/31144* (2013.01); *H01L 21/32139* (2013.01); *H01L 27/108* (2013.01); *H01L 21/30625* (2013.01); *H01L 27/1052* (2013.01); *H01L 27/105* (2013.01); *H01L 21/31116* (2013.01)
USPC .......... 438/738; 438/743; 438/744; 438/742; 438/253; 438/396; 257/E21.293; 257/E21.647

(58) Field of Classification Search
CPC .................. H01L 21/31116; H01L 21/30625; H01L 27/105; H01L 27/1052; H01L 27/108; H01L 21/31144; H01L 21/32139; H01L 28/92
USPC ................. 438/742, 743, 744, 253, 396, 738; 257/E21.293, E21.647
See application file for complete search history.

(56) References Cited

U.S. PATENT DOCUMENTS

| | | |
|---|---|---|
| 4,570,328 A | 2/1986 | Price et al. |
| 5,061,650 A | 10/1991 | Dennison et al. |

(Continued)

*Primary Examiner* — Mary Wilczewski
(74) *Attorney, Agent, or Firm* — Wells St. John P.S.

(57) ABSTRACT

The invention includes methods for selectively etching insulative material supports relative to conductive material. The invention can include methods for selectively etching silicon nitride relative to metal nitride. The metal nitride can be in the form of containers over a semiconductor substrate, with such containers having upwardly-extending openings with lateral widths of less than or equal to about 4000 angstroms; and the silicon nitride can be in the form of a layer extending between the containers. The selective etching can comprise exposure of at least some of the silicon nitride and the containers to $Cl_2$ to remove the exposed silicon nitride, while not removing at least the majority of the metal nitride from the containers. In subsequent processing, the containers can be incorporated into capacitors.

10 Claims, 15 Drawing Sheets

(56) References Cited

U.S. PATENT DOCUMENTS

| | | | |
|---|---|---|---|
| 5,520,770 A | 5/1996 | Namose | |
| 5,739,065 A | 4/1998 | Lin | |
| 5,952,246 A | 9/1999 | Wang et al. | |
| 6,037,218 A | 3/2000 | Dennison et al. | |
| 6,180,450 B1 | 1/2001 | Dennison et al. | |
| 6,225,203 B1 | 5/2001 | Liu et al. | |
| 6,229,169 B1 | 5/2001 | Hofmann et al. | |
| 6,475,915 B1 | 11/2002 | Wang | |
| 7,067,385 B2 | 6/2006 | Manning | |
| 7,125,781 B2 | 10/2006 | Manning et al. | |
| 7,271,051 B2 | 9/2007 | Manning et al. | |
| 7,320,911 B2 | 1/2008 | Basceri et al. | |
| 7,387,939 B2 | 6/2008 | Manning et al. | |
| 7,393,743 B2 | 7/2008 | Manning | |
| 7,413,952 B2 | 8/2008 | Busch et al. | |
| 7,420,238 B2 | 9/2008 | Manning et al. | |
| 7,439,152 B2 | 10/2008 | Manning et al. | |
| 7,449,391 B2 | 11/2008 | Manning et al. | |
| 7,459,362 B2 * | 12/2008 | Juengling | 438/253 |
| 7,534,694 B2 | 5/2009 | Manning | |
| 7,544,563 B2 * | 6/2009 | Manning | 438/253 |
| 7,557,013 B2 | 7/2009 | Bhat et al. | |
| 7,557,015 B2 | 7/2009 | Sandhu et al. | |
| 7,585,741 B2 * | 9/2009 | Manning | 438/396 |
| 7,618,874 B1 * | 11/2009 | Shea et al. | 438/396 |
| 7,655,968 B2 * | 2/2010 | Manning | 257/302 |
| 7,666,797 B2 | 2/2010 | Shea et al. | |
| 7,682,924 B2 * | 3/2010 | Bhat et al. | 438/393 |
| 7,683,413 B2 * | 3/2010 | Graettinger et al. | 257/296 |
| 7,696,056 B2 * | 4/2010 | Kiehlbauch et al. | 438/396 |
| 7,700,469 B2 * | 4/2010 | Benson | 438/552 |
| 7,713,813 B2 * | 5/2010 | Raghu | 438/243 |
| 7,736,987 B2 * | 6/2010 | Manning et al. | 438/396 |
| 7,781,818 B2 * | 8/2010 | Manning et al. | 257/304 |
| 8,076,248 B2 | 12/2011 | Shea et al. | |
| 8,470,716 B2 * | 6/2013 | Shea et al. | 438/744 |
| 8,691,704 B2 * | 4/2014 | Shea et al. | 438/744 |
| 2002/0098654 A1 | 7/2002 | Durcan et al. | |
| 2005/0054159 A1 | 3/2005 | Manning et al. | |
| 2008/0045034 A1 | 2/2008 | Shea et al. | |
| 2008/0128773 A1 | 6/2008 | Moll et al. | |
| 2010/0105186 A1 * | 4/2010 | Shea et al. | 438/381 |
| 2012/0052650 A1 * | 3/2012 | Shea et al. | 438/381 |
| 2013/0252398 A1 * | 9/2013 | Shea et al. | 438/386 |

* cited by examiner

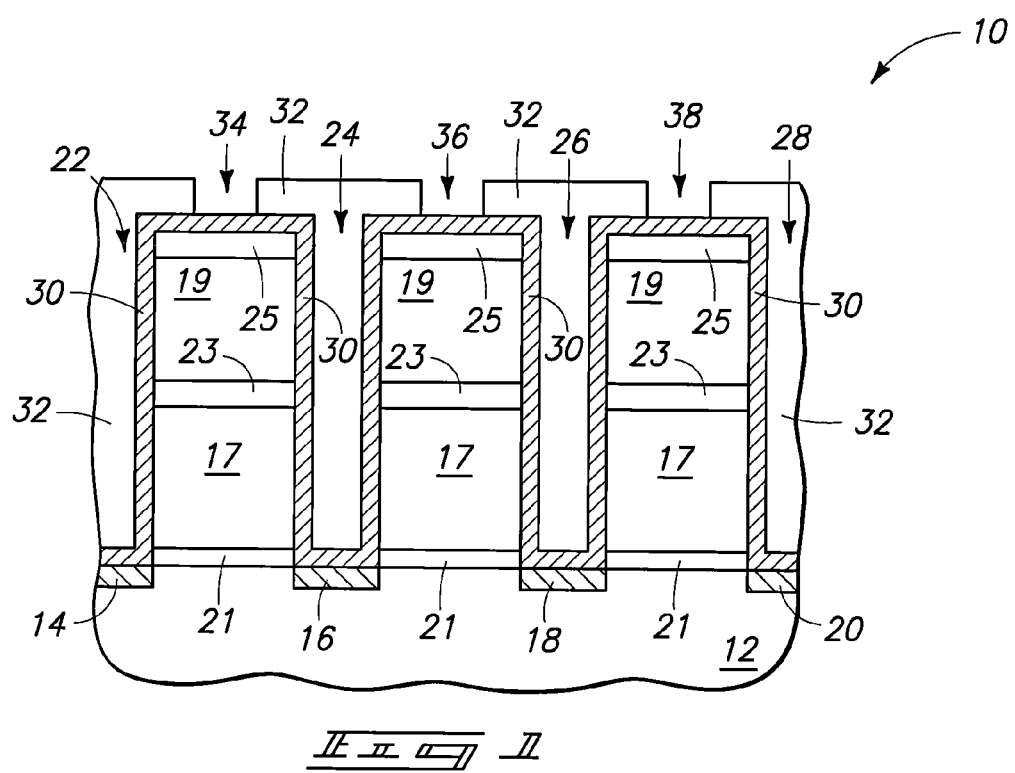
F I G 1
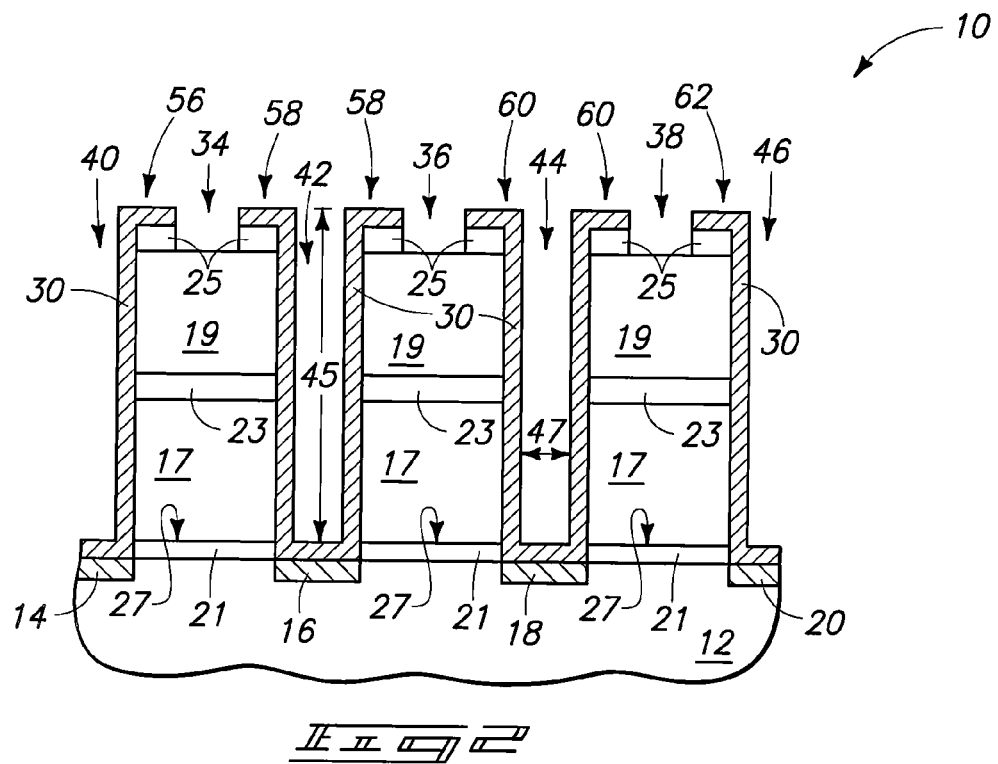
F I G 2

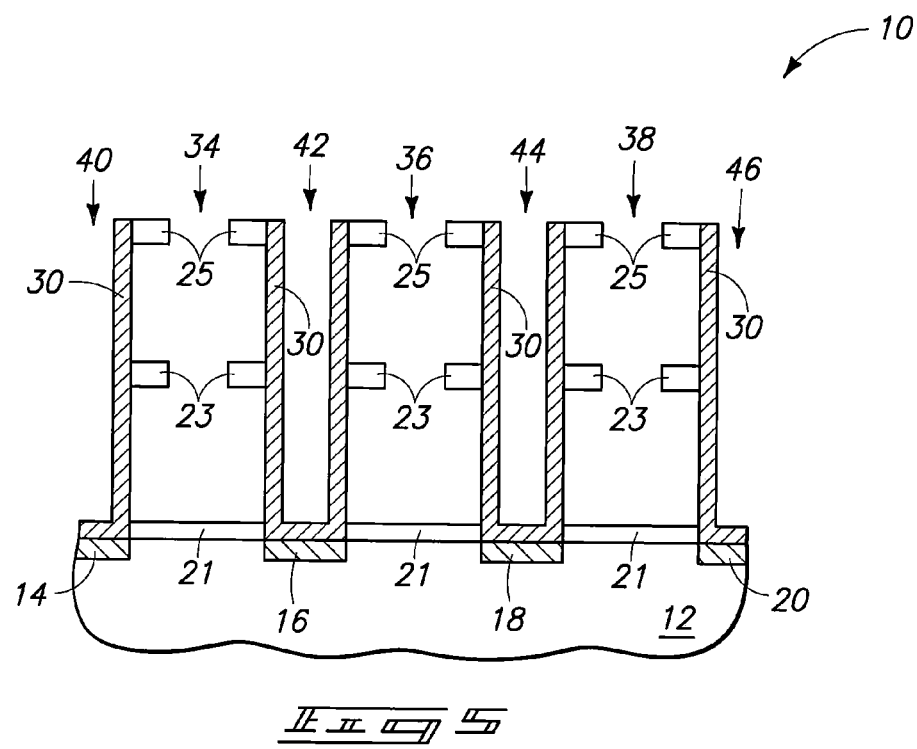
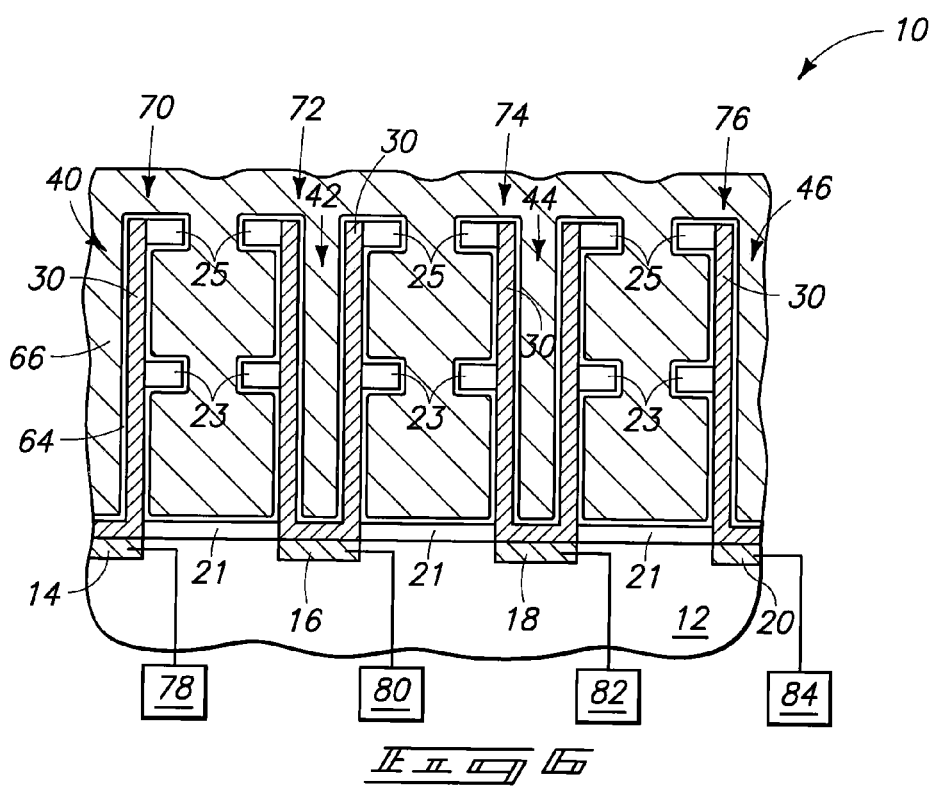

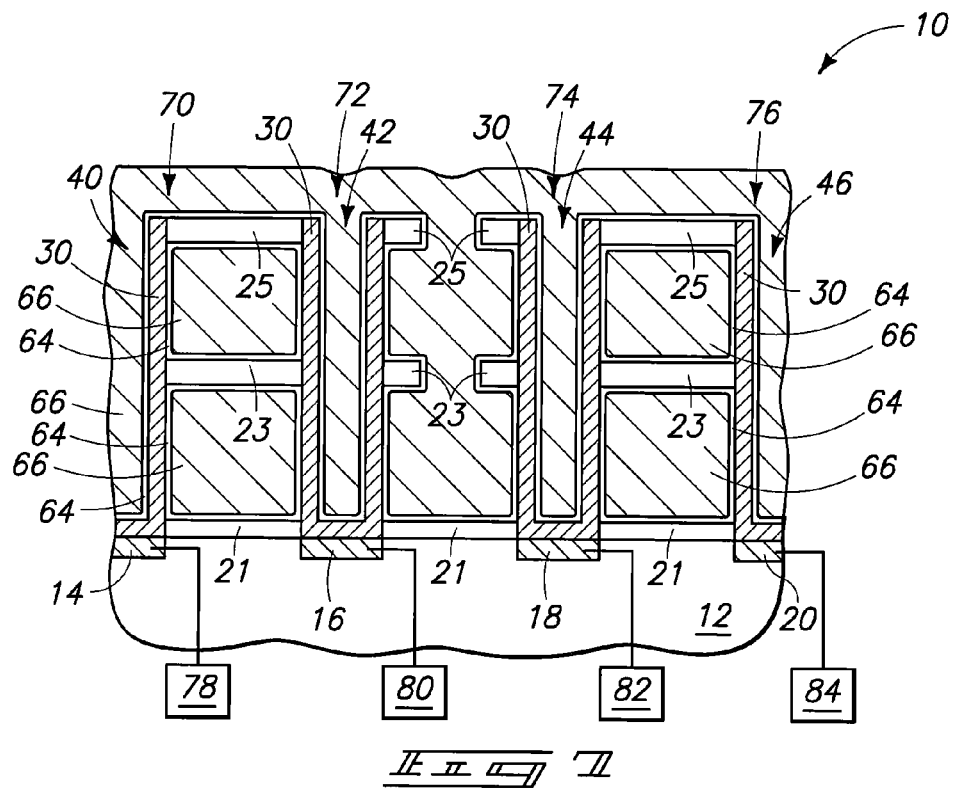
F I G. 7
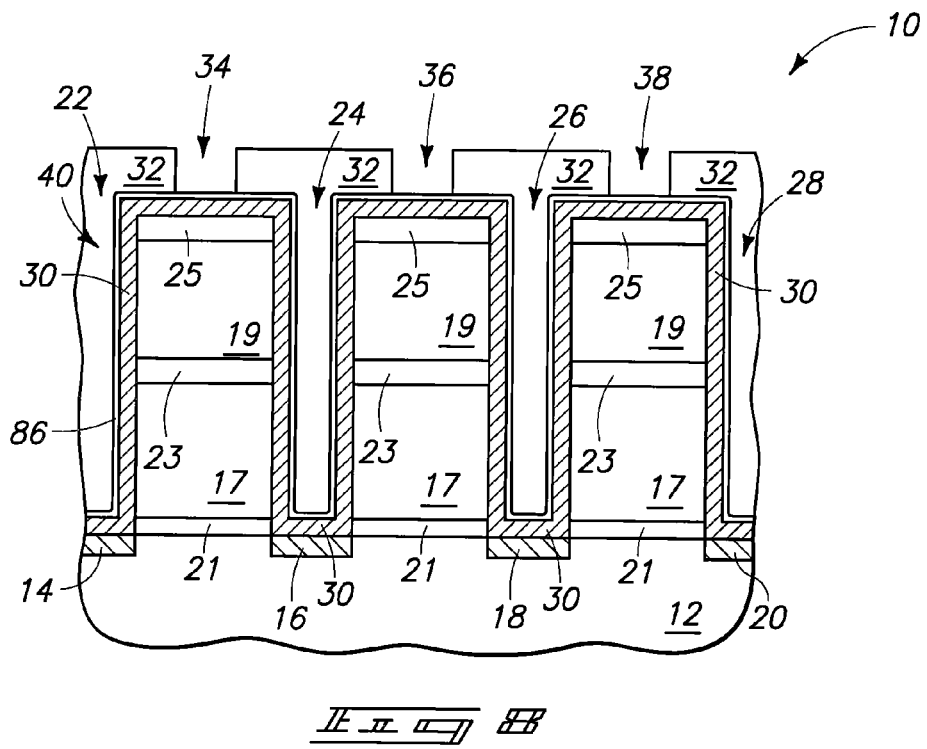
F I G. 8

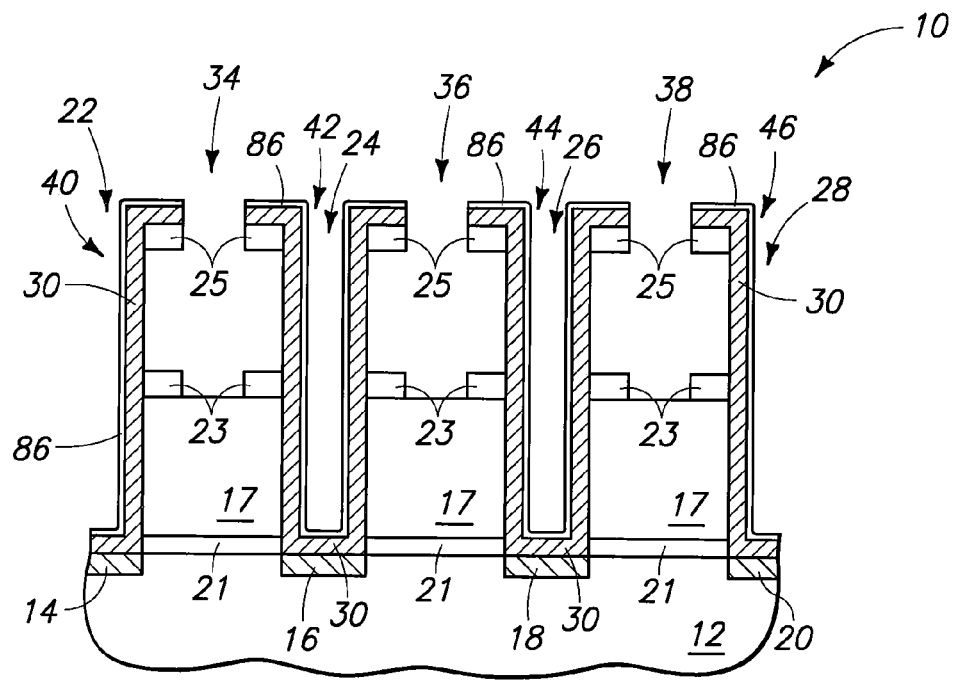
_F I G_ _11_
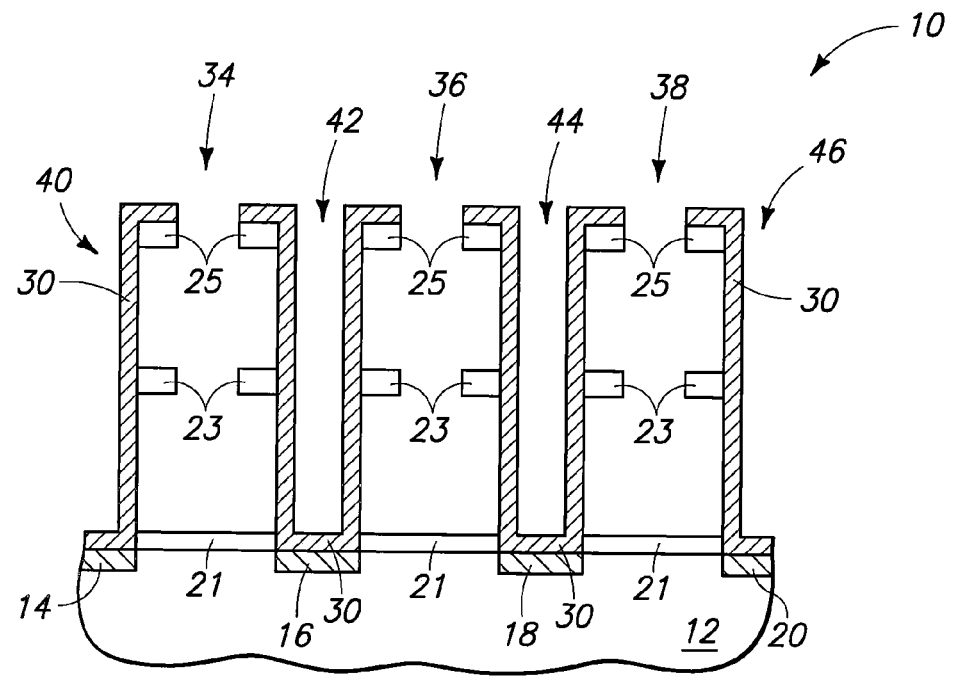
_F I G_ _12_

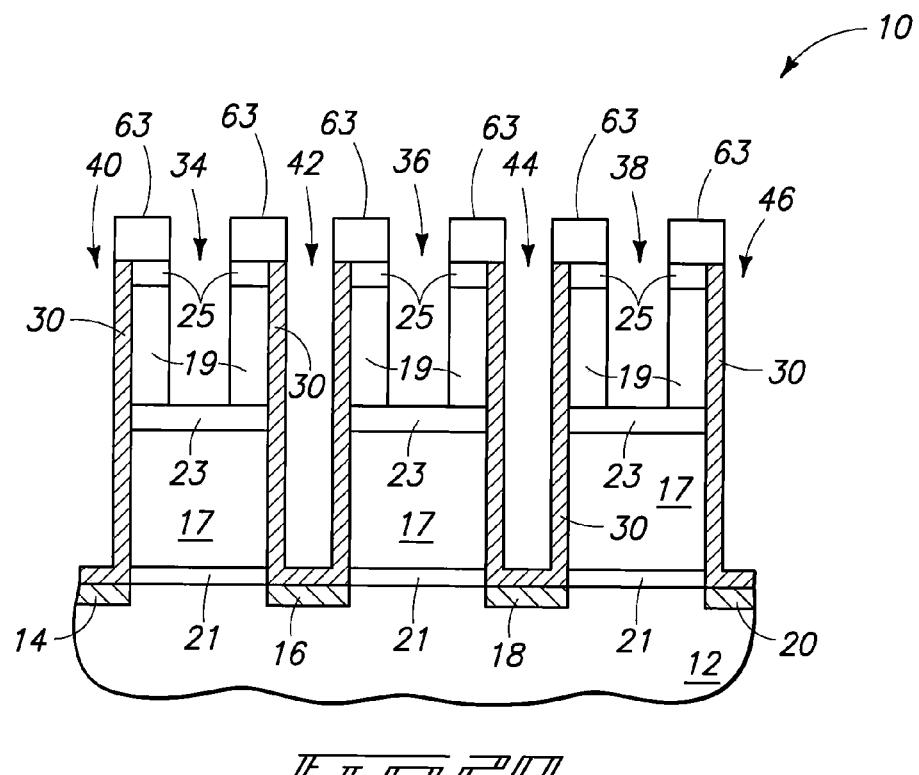
F I G 20
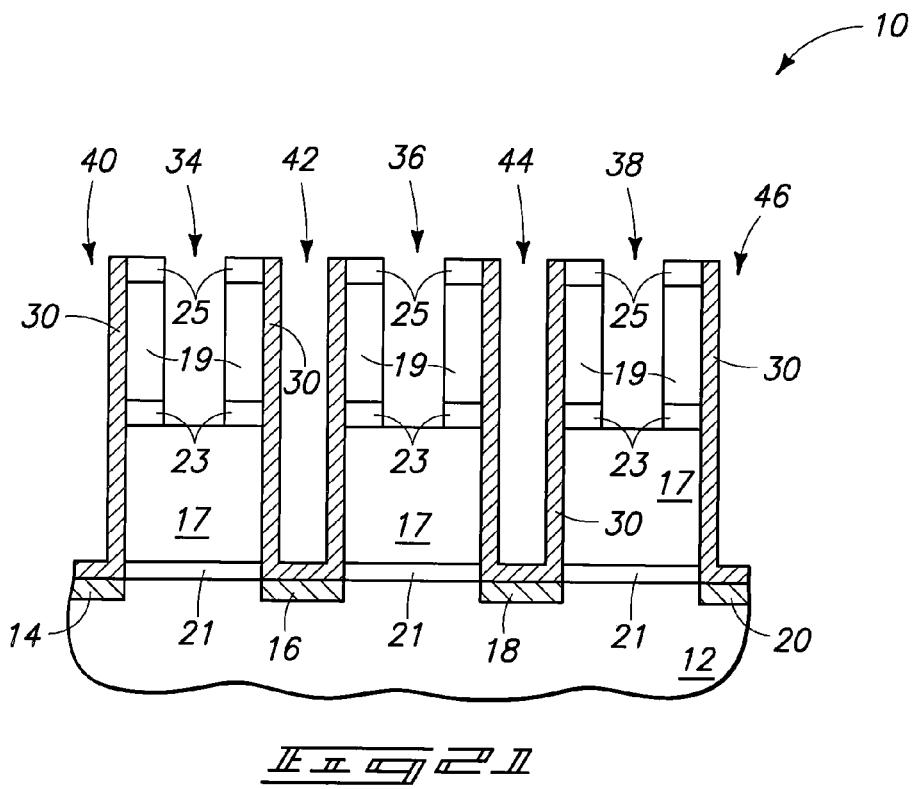
F I G 21

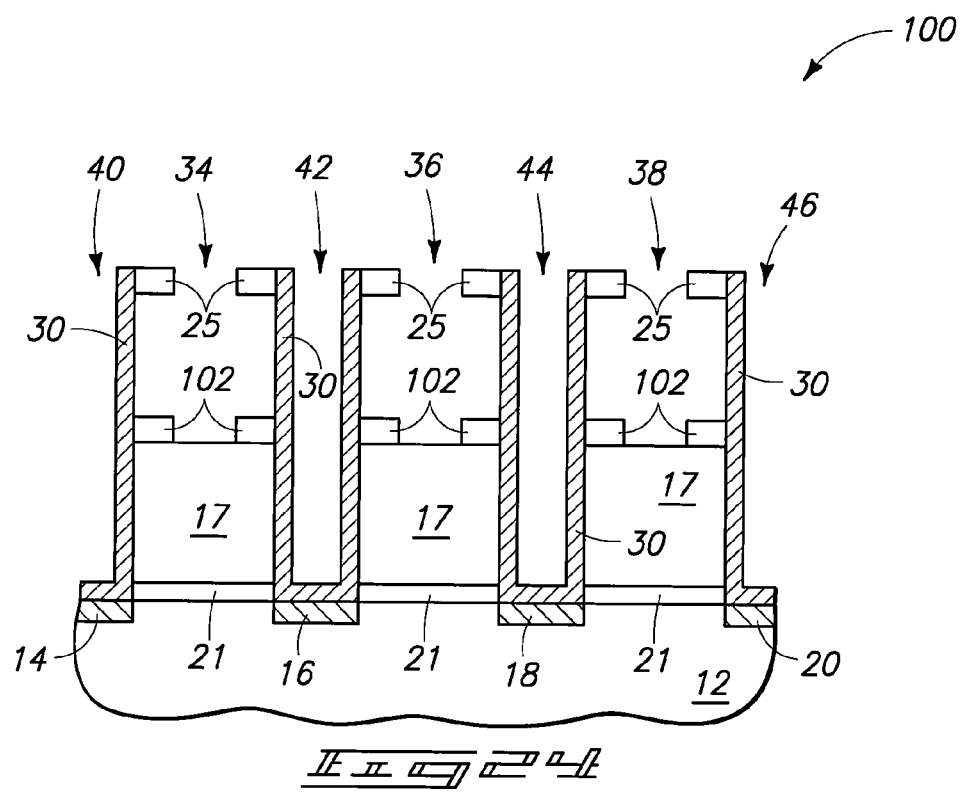
_FIG 24_
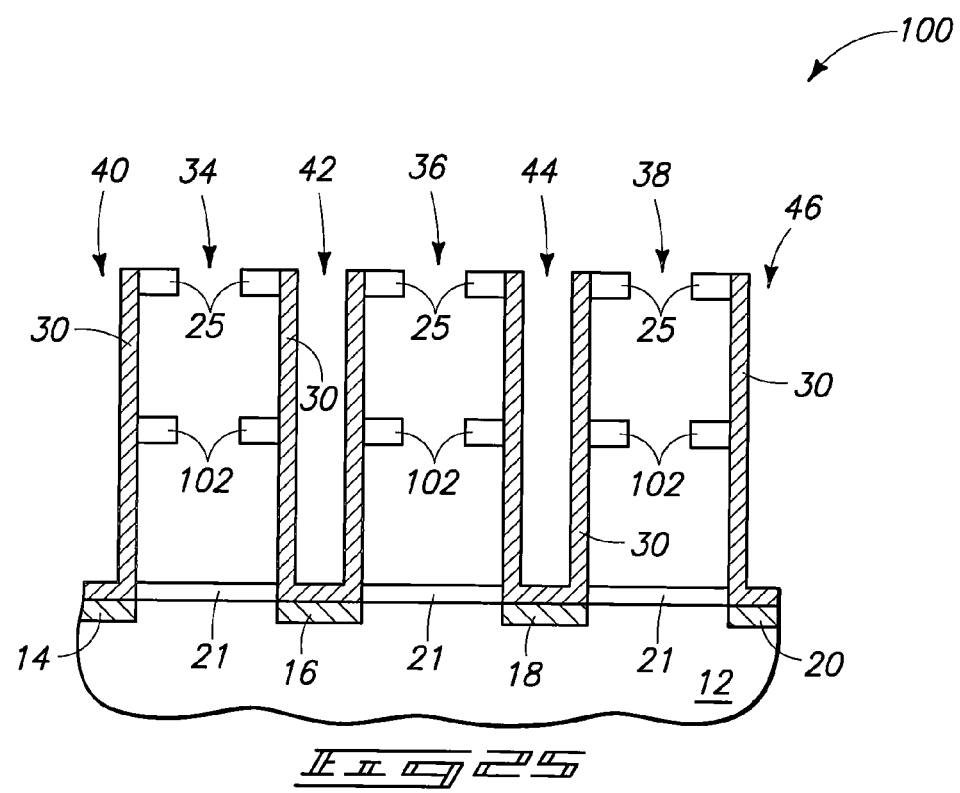
_FIG 25_

METHODS FOR FORMING SEMICONDUCTOR CONSTRUCTIONS, AND METHODS FOR SELECTIVELY ETCHING SILICON NITRIDE RELATIVE TO CONDUCTIVE MATERIAL

RELATED PATENT DATA

This patent resulted from a divisional of U.S. patent application Ser. No. 13/904,828, which was filed May 29, 2013, and which is hereby incorporated herein by reference; which resulted from a divisional of U.S. patent application Ser. No. 13/288,715, which was filed Nov. 3, 2011, which issued as U.S. Pat. No. 8,470,716, and which is hereby incorporated herein by reference; which resulted from a divisional of U.S. patent application Ser. No. 12/652,955, which was filed Jan. 6, 2010, which issued as U.S. Pat. No. 8,076,248; and which is hereby incorporated herein by reference; which resulted from a divisional of U.S. patent application Ser. No. 11/506,347, which was filed Aug. 17, 2006, which issued as U.S. Pat. No. 7,666,797, and which is hereby incorporated herein by reference.

TECHNICAL FIELD

The invention pertains to methods of forming semiconductor constructions, and in particular aspects pertains to methods for selectively etching one material relative to another; such as, for example, selectively etching silicon nitride relative to conductive material.

BACKGROUND OF THE INVENTION

Numerous applications are known in which it is desired to selectively etch one material relative to another. For instance, it is frequently desired to selectively etch silicon nitride relative to metal nitride (with exemplary metal nitride being titanium nitride, tantalum nitride, hafnium nitride, aluminum nitride, etc.). For purposes of interpreting this disclosure and the claims that follow, an etch is considered to be selective for a first material relative to a second material if the etch removes the first material at a faster rate than the second material, which can include, but is not limited to, etches which are 100% selective for the first material relative to the second material.

Among the applications in which it can be desired to selectively etch silicon nitride relative to metal nitride are applications in which silicon nitride lattices are patterned to support metal nitride-comprising capacitor containers, such as, for example, processing analogous to that described in United States Patent Application Publication number 2005/0054159.

It is desired to develop new methods for utilizing lattices to support capacitor storage nodes. It is further desired to develop new methods for selectively etching silicon nitride relative to conductive material, and it would be particularly desirable for such methods to be applicable to processes in which silicon nitride lattices are patterned to support capacitor containers. It is further desirable to develop new methods for selectively etching one material relative to another.

BRIEF DESCRIPTION OF THE DRAWINGS

Preferred embodiments of the invention are described below with reference to the following accompanying drawings.

FIG. 1 is a diagrammatic, fragmentary, cross-sectional view of a semiconductor construction at a preliminary processing stage of an exemplary aspect of the present invention.

FIG. 2 is a view of the FIG. 1 fragment shown at a processing stage subsequent to that of FIG. 1.

FIG. 5 is a view of the FIG. 1 fragment shown at a processing stage subsequent to that of FIG. 4.

FIG. 6 is a view of the FIG. 1 fragment shown at a processing stage subsequent to that of FIG. 5.

FIG. 7 is a diagrammatic, fragmentary, cross-sectional view of a semiconductor construction at a processing stage similar to that of FIG. 6 in accordance with another aspect of the invention.

FIG. 8 is a diagrammatic, fragmentary, cross-sectional view of a semiconductor construction at a preliminary processing stage of yet another exemplary aspect of the present invention.

FIG. 11 is a view of the FIG. 8 fragment shown at a processing stage subsequent to that of FIG. 10.

FIG. 12 is a view of the FIG. 8 fragment shown at a processing stage subsequent to that of FIG. 11.

FIG. 20 is a diagrammatic, fragmentary, cross-sectional view of a semiconductor construction at a preliminary processing stage of yet another exemplary aspect of the present invention.

FIG. 21 is a view of the FIG. 20 fragment shown at a processing stage subsequent to that of FIG. 20.

FIG. 24 is a view of the FIG. 23 fragment shown at a processing stage subsequent to that of FIG. 23.

FIG. 25 is a view of the FIG. 23 fragment shown at a processing stage subsequent to that of FIG. 24.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes new methods for selectively etching one material relative to another.

In some aspects, the invention includes new methods for selectively etching silicon nitride relative to conductive material, and in particular aspects the invention utilizes a combination of geometry and etch chemistry to accomplish such selective etching. Specifically, the conductive material can be formed as containers having upwardly-extending openings, and the silicon nitride can be formed as one or more layers between the containers. The openings of the containers can be of suitable aspect ratio so that the openings are at least about one micron deep (in some aspects, at least about 5 microns deep), and less than or equal to 4000 angstroms in maximum lateral width.

The etch chemistry can be chosen so that reactive species suitable for etching the conductive material do not penetrate very deeply into the openings (which can occur, for example, if the travel distance of the reactive species into the openings is limited by mean free path, or ionic activity time), but so that reactive species suitable for etching silicon nitride reach one or more of the silicon nitride layers.

Suitable etch chemistry for some aspects of the invention utilizes $Cl_2$ as the primary etchant, and can utilize a relatively high substrate bias during the etch (such as, for example, a bias of at least about 25 watts, at least about 50 watts, or at least about 150 watts, and in particular aspects the bias can be from about 25 watts to about 500 watts). The conductive material can be any of various compositions, and in particular aspects can comprise, consist essentially of, or consist of a metal nitride; such as, for example, one or more of titanium nitride, tantalum nitride, aluminum nitride, and hafnium nitride. In some aspects the conductive material can include one or more compositions selected from suitable metals, metal-containing compositions (metal nitrides, conductive metal oxides, etc.), and conductively-doped semiconductor materials (such as, for example, conductively-doped silicon).

Figure 16:
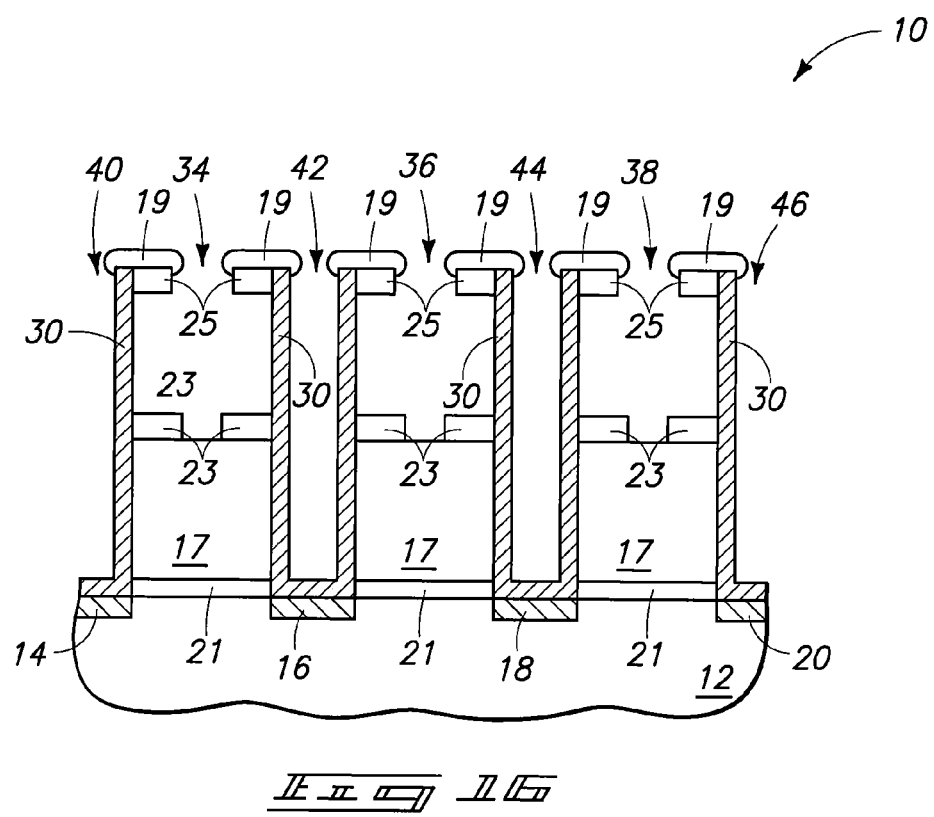
FIG. 16 is a view of the FIG. 13 fragment shown at a processing stage subsequent to that of FIG. 15.
Figure 17:
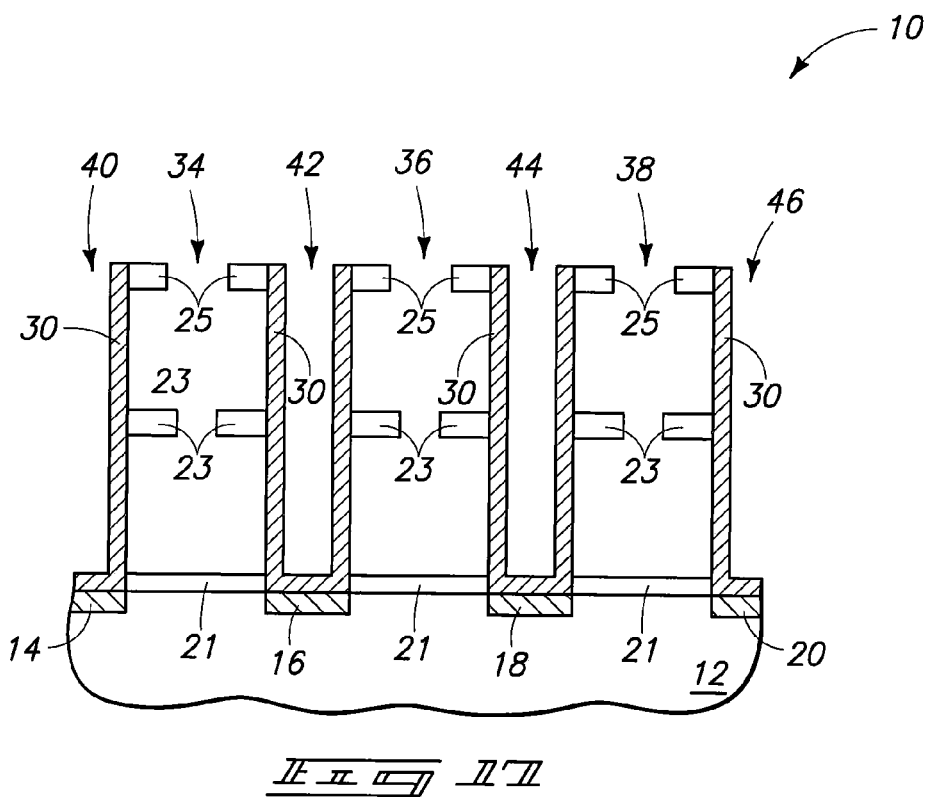
FIG. 17 is a view of the FIG. 13 fragment shown at a processing stage subsequent to that of FIG. 16.
Figure 18:
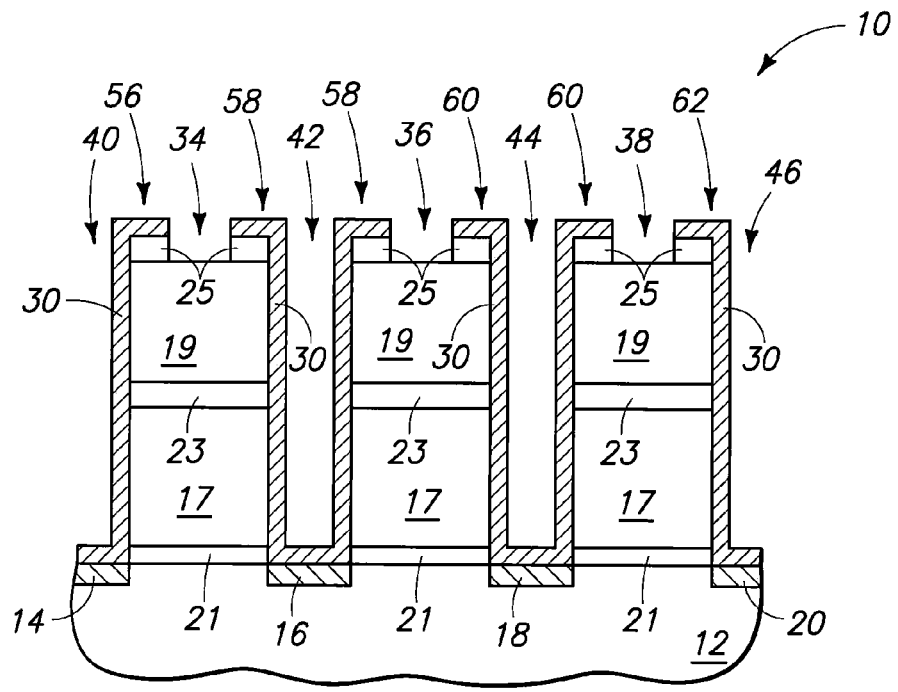
FIG. 18 is a diagrammatic, fragmentary, cross-sectional view of a semiconductor construction at a preliminary processing stage of yet another exemplary aspect of the present invention.
Figure 19:
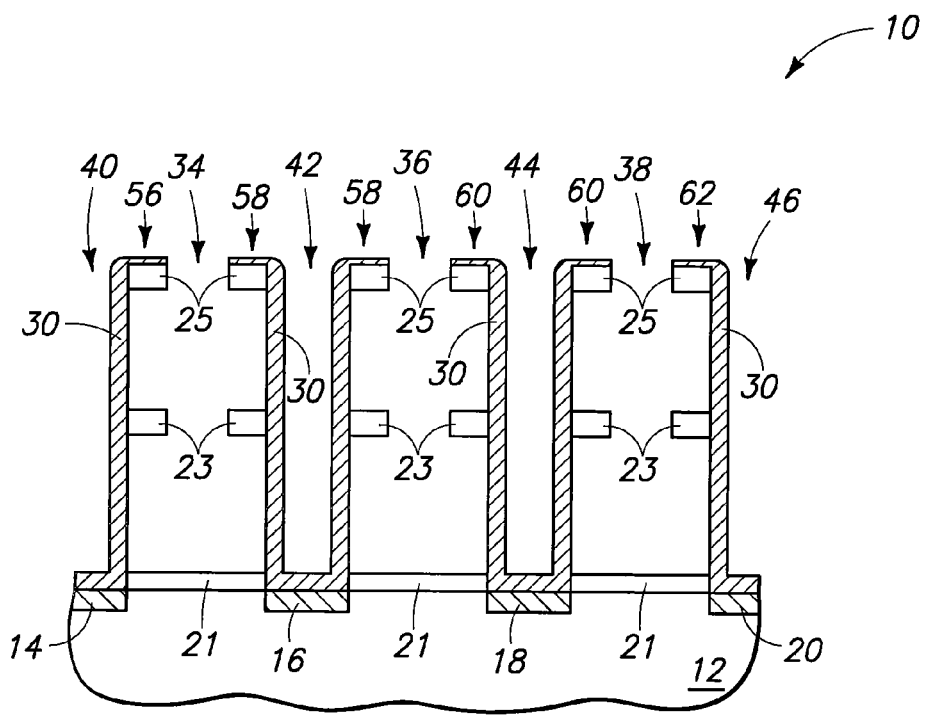
FIG. 19 is a view of the FIG. 18 fragment shown at a processing stage subsequent to that of FIG. 19.
Figure 22:
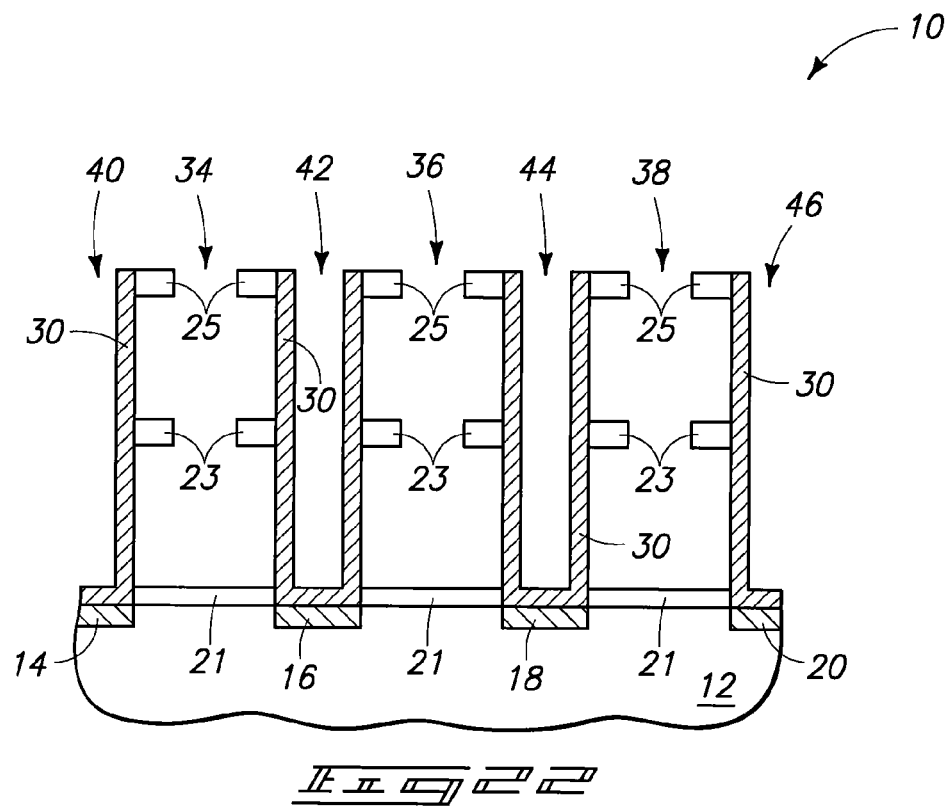
FIG. 22 is a view of the FIG. 20 fragment shown at a processing stage subsequent to that of FIG. 21.
Figure 23:
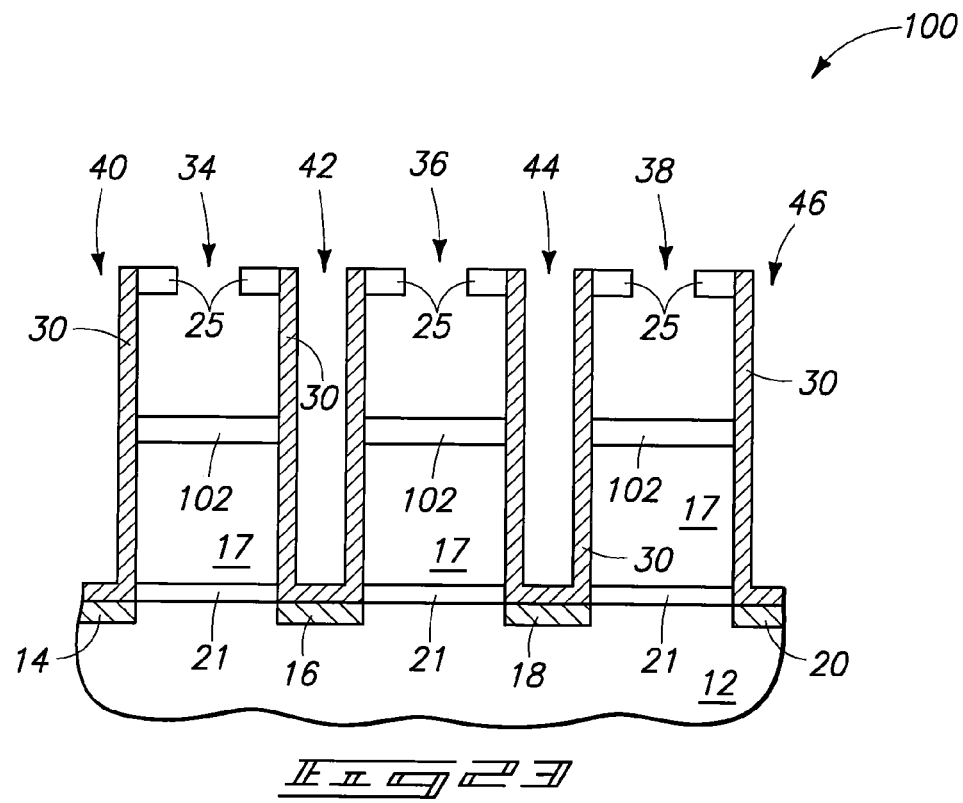
FIG. 23 is a diagrammatic, fragmentary, cross-sectional view of a semiconductor construction at a preliminary processing stage of yet another exemplary aspect of the present invention.

Exemplary aspects of the invention are described with reference to FIGS. 1-29; with FIGS. 1-7 illustrating a first aspect of the invention, FIGS. 8-12 illustrating a second aspect of the invention, FIGS. 13-17 illustrating a third aspect of the invention, FIGS. 18 and 19 illustrating a fourth aspect of the invention, FIGS. 20-22 illustrating a fifth aspect of the invention, FIGS. 23-25 illustrating a sixth aspect of the invention, and FIGS. 26-29 illustrating exemplary systems that can be utilized in some applications of the invention.

Referring to FIG. 1, such shows a semiconductor construction 10 comprising a semiconductor material base 12 supporting a plurality of electrical nodes 14, 16, 18 and 20. In the shown aspect, the nodes are conductively-doped diffusion regions extending within the semiconductor material of base 12.

Base 12 can comprise, consist essentially of, or consist of, for example, monocrystalline silicon lightly-doped with background p-type dopant, and can be referred to as a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The conductively-doped diffusion regions can correspond to either n-type doped regions or p-type doped regions. Although the regions are shown as being conductively-doped at the processing stage of FIG. 1, it is to be understood that the regions could, in some aspects, be doped at a processing stage subsequent to that of FIG. 1. Accordingly, the shown conductively-doped regions can, in some aspects, correspond to locations for conductively-doped regions at the processing stage of FIG. 1, rather than to actual conductively-doped regions.

A plurality of electrically insulative materials 17, 19, 21, 23 and 25 are stacked over base 12, and such can be considered supporting materials in that they support conductive material containers (discussed below). The insulative materials 17 and 19 can be oxide-containing materials, and in particular aspects can comprise, consist essentially of, or consist of silicon dioxide ($SiO_2$) or doped silicon oxide (with exemplary doped silicon oxide being, for example, borophosphosilicate glass, BPSG, and phosphosilicate glass, PSG). Materials 17 and 19 can be referred to as sacrificial oxides in some aspects of the invention.

The insulative materials 21, 23 and 25 can comprise, consist essentially of, or consist of silicon nitride; and can have exemplary thicknesses of from about 100 Å to about 3000 Å. In some aspects, the layers of materials 21, 23 and 25 can be referred to as nitride-containing layers. In other aspects, at least one of the materials 21, 23 and 25 can comprise a composition other than silicon nitride. For instance, FIGS. 23-25 (discussed below) illustrate an aspect of the invention in which material 23 is replaced with a composition (such as polysilicon) which is selectively etchable relative to silicon nitride of layer 25.

In the aspect of the invention of FIG. 1, the insulative materials can correspond to, in ascending order from base 12, a first nitride-containing layer of material 21, a first oxide-containing material 17, a second nitride-containing layer of material 23, a second oxide-containing material 19, and a third nitride-containing layer of material 25. It is to be understood that the stack can comprise other combinations of layers besides those shown, and can, for example, comprise less than the three shown nitride-containing layers or more than the three shown nitride-containing layers, and/or can comprise less than the two shown oxide-containing layers or more than the two shown oxide-containing layers A plurality of openings 22, 24, 26 and 28 extend through materials 17, 19, 21, 23 and 25 to the nodes 14, 16, 18 and 20, respectively. A conductive material 30 extends across an upper surface of material 25, and within openings 22, 24, 26 and 28. Material 30 can comprise one or more electrically conductive compositions. For example, material 30 can include various metals (for instance, Ti, W, and Ru), metal-containing compositions (for instance, metal nitride, conductive metal oxide, etc.), and/or conductively doped semiconductor material (for instance, conductively-doped polysilicon). In some aspects material 30 can comprise, consist essentially of, or consist of one or more of titanium nitride, tantalum nitride, aluminum nitride and hafnium nitride. Typically, material 30 will consist essentially of, or consist of titanium nitride. Material 30 have a thickness of from about 50 angstroms to about 600 angstroms. Although material 30 is shown as being homogeneous in composition, it is to be understood that the material can comprise layers of differing composition. Material 30 can be directly against nodes 14, 16, 18 and 20, as shown; or can join to the nodes through electrically conductive layers, for instance metal silicide, and/or pedestals.

A patterned masking material 32 is provided over material 30. The masking material can comprise any suitable composition, and typically will correspond to a photoresist. A plurality of gaps 34, 36, and 38 extend through the patterned masking material.

Referring to FIG. 2, the gaps 34, 36 and 38 are extended through materials 25 and 30, and masking material 32 (FIG. 1) is removed. The extension of gaps 34, 36 and 38 through materials 25 and 30 exposes oxide-containing material 19.

The gaps 34, 36 and 38 subdivide the remaining material 30 into a plurality of separate upwardly-opening containers 40, 42, 44 and 46. Each of the containers is in electrical connection with one of the conductive nodes 14, 16, 18 and 20. The upwardly-extending openings within the containers have depths 45 (labeled for one of the openings) and widths 47 (labeled for another of the openings). The widths extend cross-sectionally across the openings, and are shown to extend laterally relative to the vertically-extending openings. The depths can be, for example, at least about one micron (in some aspects, at least about five microns), and the maximum cross-sectional widths (which can also be considered maximum cross-sectional lateral dimensions of the openings in some aspects of the invention) will typically be less than or equal to about 4000 angstroms. In particular aspects, the maximum cross-sectional widths can be less than equal to about 2000 angstroms, or even less than or equal to about 1000 angstroms.

In the shown aspect of the invention, silicon nitride-containing layer 21 is in direct contact with an uppermost surface of semiconductor base 12, and in some aspects such silicon nitride-containing layer can be in direct contact with monocrystalline silicon of the semiconductor base. Silicon nitride-containing layer 21 has an uppermost surface 27 that is approximately coextensive with bottommost surfaces of containers 40, 42, 44 and 46, and which accordingly can be at least about one micron beneath uppermost surfaces of the containers, and in some aspects can be at least about five microns beneath the uppermost surfaces of the containers. The silicon nitride-containing layer 23 can be at least about one-half micron beneath the uppermost surfaces of the containers (or in other words, can have an uppermost surface that is at least about one-half micron beneath the uppermost surfaces of the containers; and in some aspects can be at least about one micron beneath the uppermost surfaces of the containers).

The containers 40, 42, 44 and 46 are shown to comprise shelves 56, 58, 60 and 62, respectively, which extend laterally outwardly over underlying materials 17, 19, 21, 23 and 25. Although each container appears to have a pair of shelves in the cross-sectional view of FIG. 2, it is to be understood that the containers would extend around the shown openings in top view so that the apparent paired shelves on either side of an opening in FIG. 2 are actually two sides of a single shelf that extends entirely around the opening. In some aspects (discussed below), the shelves of material 30 can be removed by planarization (for example, CMP) prior to subsequent processing.

Figure 3:
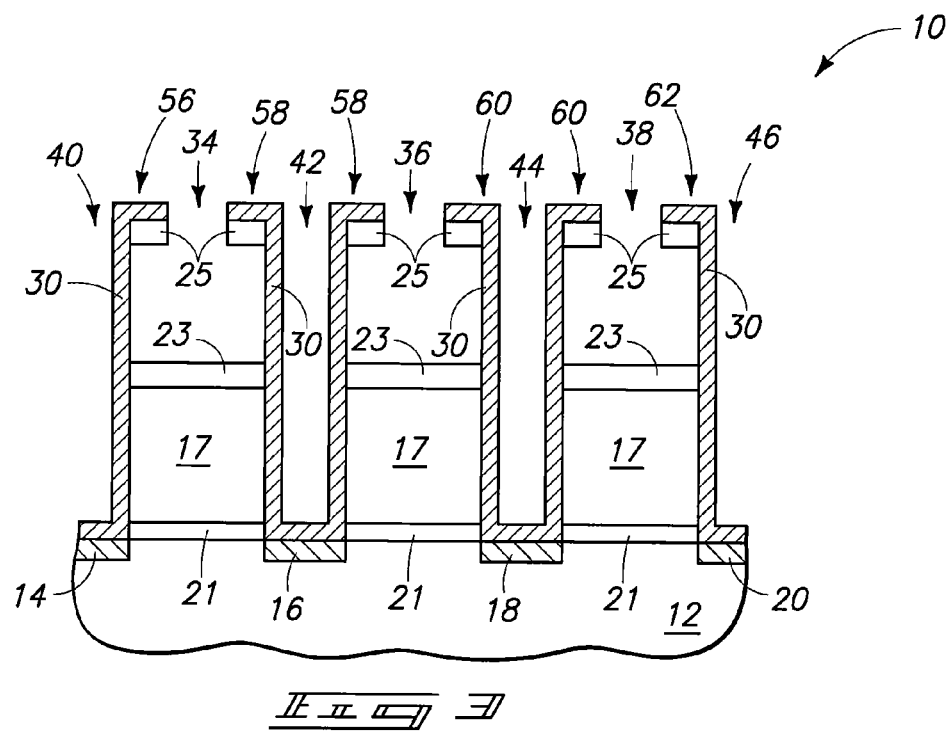
FIG. 3 is a view of the FIG. 1 fragment shown at a processing stage subsequent to that of FIG. 2.

Referring to FIG. 3, oxide-containing material 19 (FIG. 2) is removed with an isotropic (wet) etch to expose nitride-containing material 23 within gaps 34, 36 and 38.

Figure 4:
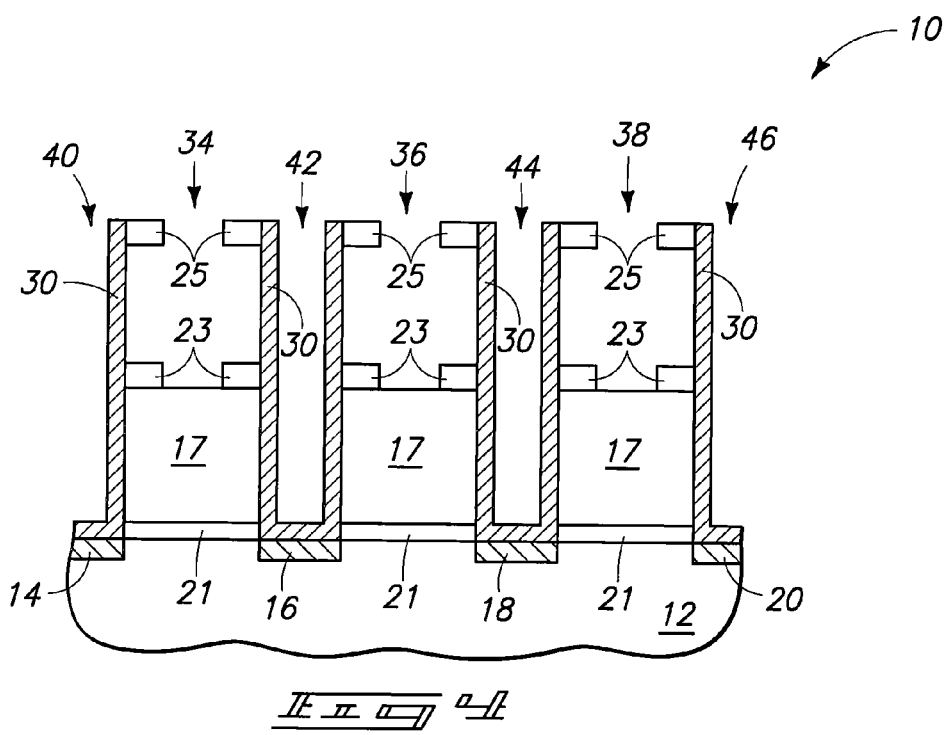
FIG. 4 is a view of the FIG. 1 fragment shown at a processing stage subsequent to that of FIG. 3.

Referring to FIG. 4, silicon nitride-containing material 23 is subjected to an anisotropic etch which transfers the pattern of gaps 34, 36 and 38 into the material 23. Specifically, portions of the silicon nitride-containing material 23 exposed through gaps 34, 36 and 38 are removed with a highly directional etch.

The etch is somewhat selective for silicon nitride relative to conductive material 30 (which is typically metal nitride), in that the etch removes exposed silicon nitride while not removing the majority of material 30 from within the various containers, even though material 30 is also exposed to the etch. In particular aspects of the invention, the etch can utilize $Cl_2$, and specifically can utilize a mixture of $Cl_2$ and helium in a ratio of 7:180 ($Cl_2$:He). The ratio of $Cl_2$ to He is a volume ratio determined by the relative flow rates of $Cl_2$ and He into a reaction chamber in which the etch is conducted. The etch can be conducted with a temperature within the reaction chamber of from about 1° C. to about 100° C., and with a pressure within the reaction chamber of from about 0.1 milliTorr to about 100 milliTorr. The base 12 will typically be biased within the chamber, with such bias being from about 50 watts to at least about 150 watts; and in some aspects being greater than or equal to about 150 watts; with exemplary bias being from about 50 watts to about 600 watts. Higher bias will tend to increase directionality of the etch, and to also increase the selectivity of the etch for silicon nitride relative to material 30.

In exemplary aspects, silicon nitride-containing material 23 can have a thickness of from about 600 Å to about 3000 Å, and the etch can be conducted for a time of from about 10 seconds to about 50 seconds to completely etch through such silicon nitride-containing material.

The shelves 56, 58, 60 and 62 (FIG. 3) of conductive material 30 are shown removed at the processing stage of FIG. 4. Such can be accomplished by CMP of material 30 from over material 25, and/or by removal of the shelves with the etching conditions used to punch through nitride-containing material 23. Notably, although the etching conditions used to punch through nitride-containing material 23 may remove the upper shelves of conductive material 30, the etching conditions preferably do not appreciably penetrate into the conductive containers 40, 42, 44 and 46. Thus, such etching conditions preferably do not appreciably remove layer 30 from within the container openings.

The selectivity of the FIG. 4 etch for silicon nitride-containing material 23 relative to the conductive material 30 within the containers is believed to be due, at least in part, to the geometry of the containers. Specifically, by utilizing containers having a relatively high aspect ratio, reactive etchant suitable for etching material 30 is substantially precluded from reaching the material 30 at any significant depth within the container openings. Yet, reactive etchant suitable for etching silicon nitride can reach entirely to, and through, the silicon nitride-containing material 23.

The reactive etchant suitable for etching silicon nitride may be a different species than the reactive etchant suitable for etching material 30 under the reaction conditions discussed above for utilization in exemplary aspects the present invention, so that silicon nitride can be etched in high aspect ratio openings that would be unsuitable for etching of material 30. Alternatively, the reactive etchant suitable for etching silicon nitride may be the same as that utilized for etching material 30, so that the geometrical constraints are the same for removal of material 30 and silicon nitride. Regardless, methodology of the present invention can advantageously remove silicon nitride from between high aspect ratio container openings while not removing conductive material (typically metal nitride) of the containers from the depths of the containers.

Referring to FIG. 5, oxide-containing material 17 (FIG. 4) is removed through the openings in material 23 with an isotropic etch. Such etch is preferable selective for oxide relative to nitride, and can, for example, be a wet etch utilizing one or more fluorine-containing compositions.

Referring to FIG. 6, containers 40, 42, 44 and 46 can be incorporated into a plurality of capacitors 70, 72, 74 and 76, respectively. Specifically, electrically insulative capacitor dielectric material 64 and electrically conductive capacitor plate material 66 are formed over and around containers 40, 42, 44 and 46, to form the capacitors 70, 72, 74 and 76. The capacitor dielectric material can comprise any suitable composition or combination of compositions, including, for example, silicon dioxide, silicon nitride, and/or various high-k materials. Also, the capacitor plate material can comprise any suitable composition or combination of compositions, including, for example, various metals, metal compositions, and/or conductively-doped semiconductor material.

In some aspects, the conductively-doped regions 14, 16, 18 and 20 can correspond to source/drain regions of transistors comprising transistor gates 78, 80, 82 and 84 (schematically illustrated in FIG. 6). As is known to persons of ordinary skill in the art, the combination of a capacitor with a transistor forms a DRAM (dynamic random access memory) unit cell. Thus, the capacitors 70, 72, 74 and 76 can be incorporated into a DRAM array.

FIG. 7 shows another arrangement of capacitors that can be formed in accordance with the above-discussed aspects of the invention. The various materials and structures of FIG. 7 are labeled identically to those of FIG. 6. The construction of FIG. 7 is similar to that of FIG. 6, except that some regions of the nitride-containing material 23 and 25 are not punched through so that such regions can correspond to straps (or supports) extending between and supporting containers of the capacitors. Persons of ordinary skill in the art will recognize that the construction of FIG. 7 is a typical construction resulting from lattice applications.

FIG. 8 shows semiconductor construction 10 at a preliminary processing stage of another aspect of the present invention, with such processing stage being analogous to that described above with reference to FIG. 1. The construction comprises the substrate 12, conductive material 30 and insulative materials 17, 19, 21, 23 and 25 discussed above. Additionally, the construction comprises the patterned masking material 32 discussed above.

The construction of FIG. 8 differs from that of FIG. 1 in that sacrificial material 86 is provided across material 30 and within upwardly-extending openings 22, 24, 26 and 28 at the processing stage of FIG. 8. In some aspects, sacrificial material 86 can comprise silicon, and the sacrificial material can, for example, comprise, consist essentially of, or consist of polysilicon, or silicon dioxide.

Figure 9:
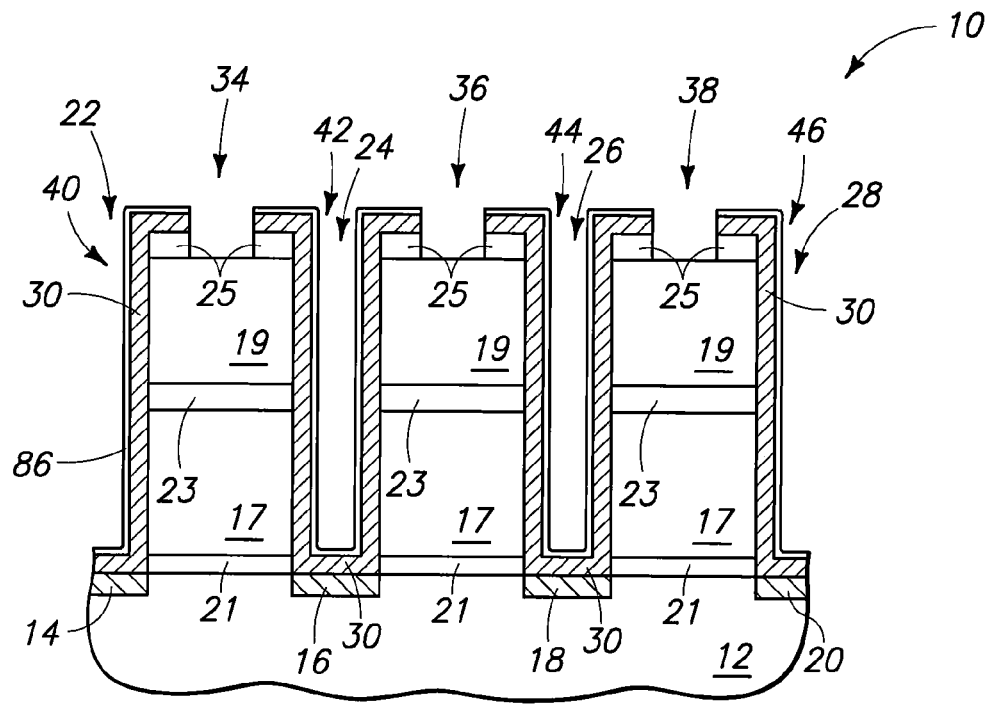
FIG. 9 is a view of the FIG. 8 fragment shown at a processing stage subsequent to that of FIG. 8.

FIG. 9, shows construction 10 at a processing stage subsequent to that of FIG. 8, and analogous to that of FIG. 2; and specifically shows material 30 patterned into a plurality of separate containers 40, 42, 44 and 46, and shows material 25 punched through. However, unlike FIG. 2, the sacrificial material 86 is exposed together with insulative material 19 at the processing stage of FIG. 8. In subsequent processing, material 19 will be removed, analogously to the removal discussed above with reference to FIG. 3. It can be desired that the material 86 be resistant to the conditions utilized during such removal so that the material 86 remains. In such applications, material 86 can comprise, for example, various polysilicon and/or insulative nitrides. Alternatively, sacrificial material 86 can consist of silicon dioxide, and can be removed during the removal of material 19.

Figure 10:
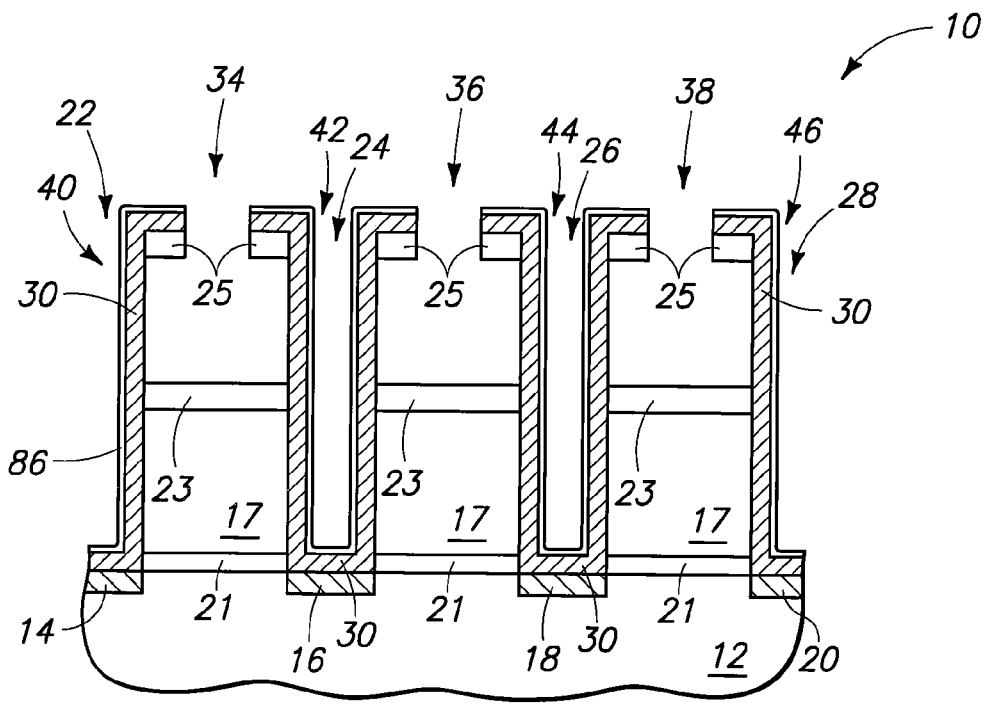
FIG. 10 is a view of the FIG. 8 fragment shown at a processing stage subsequent to that of FIG. 9.

FIG. 10 shows construction 10 at a processing stage subsequent to that of FIG. 9, and analogous to that of FIG. 3; and specifically shows the construction after material 19 (FIG. 9) has been removed with an isotropic etch.

FIG. 11 shows construction 10 at a processing stage subsequent to that of FIG. 10, and analogous to that of FIG. 4; and specifically shows the construction after material 23 has been punched through with an anisotropic etch.

FIG. 12 shows construction 10 at a processing stage subsequent to that of FIG. 11, and analogous to that of FIG. 5; and specifically shows the construction after material 17 (FIG. 11) has been removed with an isotropic etch; and after removal of material 86. Sacrificial material 86 can be removed after the isotropic etch of material 17. If sacrificial material 86 consists of polysilicon, it can be selectively removed relative to materials 30, 21, 23 and 25 with an isotropic wet etch utilizing TMAH. The construction of FIG. 12 can subsequently be processed to incorporate the containers 40, 42, 44 and 46 into a plurality of capacitors (analogously to the processing described above with reference to FIG. 6).

Figure 13:
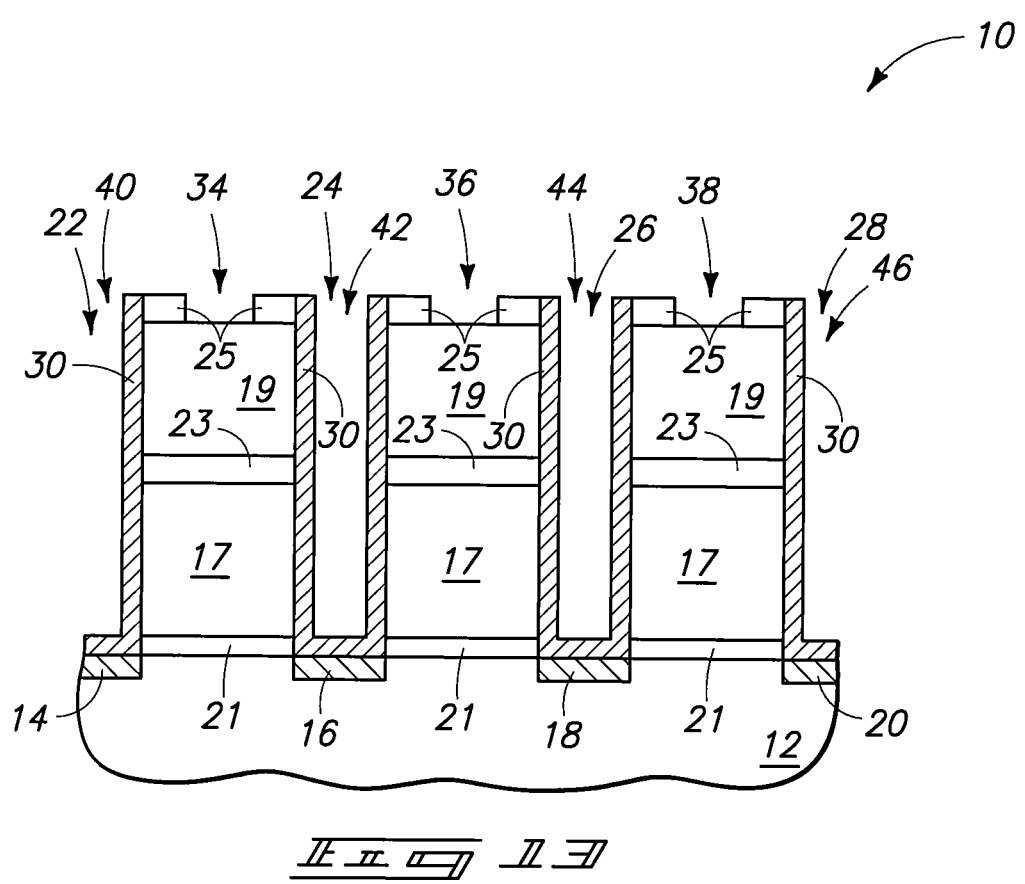
FIG. 13 is a diagrammatic, fragmentary, cross-sectional view of a semiconductor construction at a preliminary processing stage of yet another exemplary aspect of the present invention.

FIGS. 13-17 illustrate another aspect of the invention. Referring to FIG. 13, construction 10 is shown at a processing stage in which gaps 34, 36 and 38 extend through uppermost nitride-containing material 25. Conductive material 30 is within openings 22, 24, 26, and 28 as containers 40, 42, 44 and 46, but is not over uppermost nitride-containing material 25. The processing stage of FIG. 13 can be subsequent to that of FIG. 2 if planarization is used to remove material 30 from over material 25.

Figure 14:
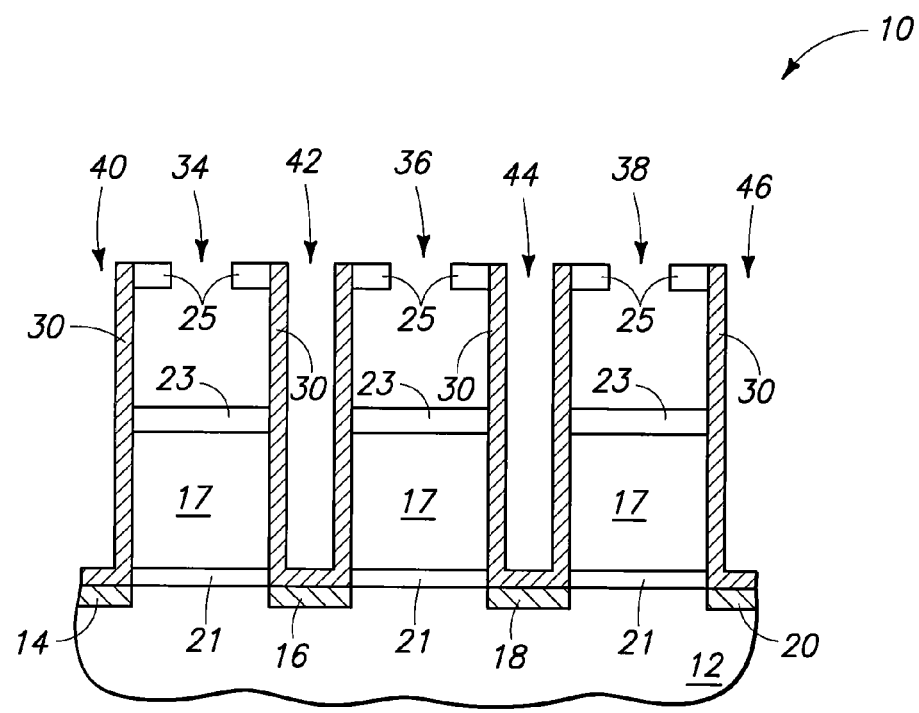
FIG. 14 is a view of the FIG. 13 fragment shown at a processing stage subsequent to that of FIG. 13.

Referring to FIG. 14, construction 10 is shown at a processing stage after material 19 (FIG. 13) has been removed through gaps 34, 36 and 38 with an isotropic etch. Such exposes nitride-containing material 23.

Figure 15:
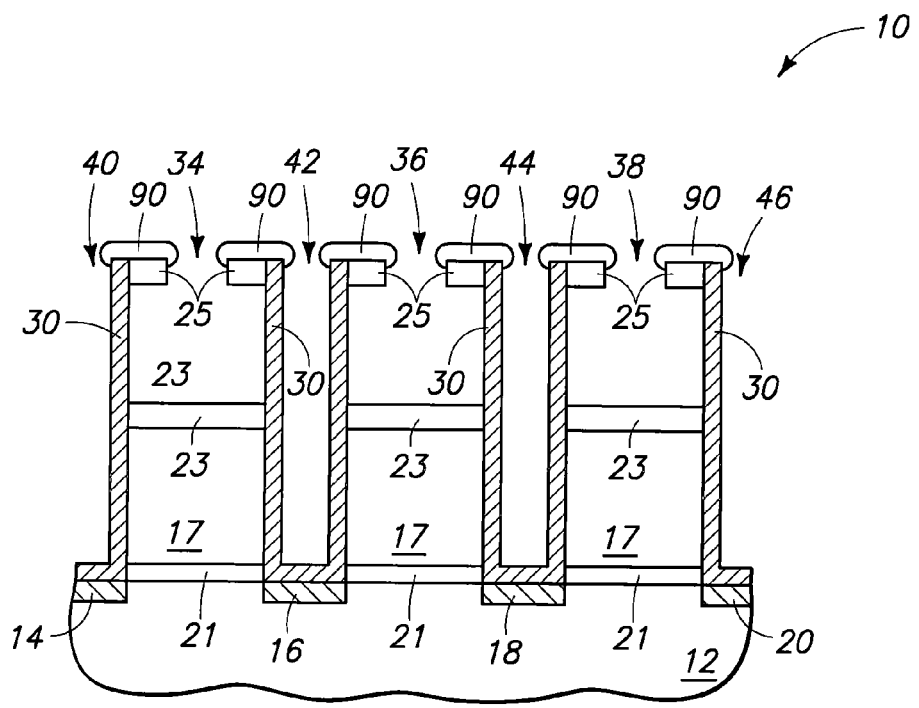
FIG. 15 is a view of the FIG. 13 fragment shown at a processing stage subsequent to that of FIG. 14.

Referring to FIG. 15, a protective material 90 is formed over uppermost nitride-containing material 25 to protect such material during a subsequent etch of underlying nitride-containing material 23. Protective material 90 can be any suitable composition or combination of compositions. In particular aspects, material 90 will comprise, consist essentially of, or consist of silicon dioxide, and will be formed under conditions having very low step coverage. In other words, the silicon dioxide will be formed under conditions in which the silicon dioxide covers uppermost surfaces, but does not penetrate through gaps 34, 36 or 38, and does not penetrate to a significant depth within containers 40, 42, 44 and 46.

FIG. 16 shows construction 10 at a processing stage after punch through of material 23 with an anisotropic etch. The protective material 90 functions as a mask during the etching of material 23. Specifically, protective 90 narrows gaps 32, 34 and 36, and the dimensions of the narrowed gaps are approximately transferred through material 23 during the anisotropic etch. The etch of material 23 can utilize the same conditions discussed above with reference to FIG. 4 for etching through material 23.

Referring to FIG. 17, oxide-containing material 17 (FIG. 16) is removed with an isotropic etch. If material 90 (FIG. 16) comprises oxide, such can be simultaneously removed with the same etch used to remove material 17 (as shown). The construction of FIG. 17 can be subsequently processed to incorporate the containers 40, 42, 44 and 46 into a plurality of capacitors (similar to the processing described above with reference to FIG. 6).

FIGS. 18 and 19 illustrate another aspect of the invention. FIG. 18 shows construction 10 at a preliminary processing stage corresponding to the processing stage of FIG. 2.

FIG. 19 shows the construction 10 at a processing stage similar to that of FIG. 5, and specifically shows the construction after it has been subjected to etches of the types described above for selectively removing silicon nitride relative to conductive material 30, and for removing oxide-containing materials 17 and 19. Such etches have extended gaps 34, 36 and 38 through the silicon nitride-containing materials 23 and 25. In contrast to the aspect of FIG. 5, the aspect of FIG. 19 shows only portions of the conductive material shelves removed from upper portions of the containers during the etching of the silicon nitride-containing materials. In other words, shelves 56, 58, 60 and 62 are reduced in thickness during such etches, but not entirely removed. The amount, if any, of material 30 remaining as the shelves 56, 58, 60 and 62 after the etching through the silicon nitride-containing materials can depend on the relative thicknesses of material 30 and silicon nitride materials 23 and 25; the duration of the etches; and the chemical selectivity (as opposed to geometrical selectivity) for silicon nitride-containing material relative to conductive material 30 that is achieved by the etching conditions.

FIGS. 20-22 illustrate another aspect of the invention. Referring to FIG. 20, such shows construction 10 at a processing stage subsequent to that of FIG. 2. A protective material 63 is over upper nitride-containing layer 25. The protective layer can comprise any suitable composition or combination of compositions, including, for example, photoresist and/or other masking materials. An anisotropic etch has been utilized to etch through oxide-containing material 19. Such anisotropic etch can utilize any suitable anisotropic etching conditions, and typically will be a so-called dry etch.

Referring to FIG. 21, protective material 63 (FIG. 20) is removed, and silicon nitride-containing material 23 is subjected to an anisotropic etch which transfers the pattern of gaps 34, 36 and 38 into the material 23. Such exposes oxide-containing material 17 through the gaps punched through material 23.

Referring to FIG. 22, oxide-containing material 17 (FIG. 21) is removed through the openings in material 23 with an isotropic etch, analogously to the processing discussed above with reference to FIG. 5. The isotropic etch also removes remaining portions of oxide-containing material 19 so that the construction of FIG. 22 is identical to that of FIG. 5.

FIGS. 23-25 illustrate another aspect of the invention. Referring to FIG. 23, such shows a construction 100 at a processing stage analogous to that of FIG. 3. However, in contrast to the aspect of FIG. 3, the aspect of FIG. 23 comprises no protective material over upper nitride-containing material 25, and shows a material 102 in place of the central nitride-containing material 23 (FIG. 3). The material 102 is preferably a composition, or combination of compositions, which can be selectively etched relative to nitride-containing material 25; and also is electrically insulative. In particular aspects, material 102 can comprise, consist essentially of, or consist of silicon carbide or silicon-based films with slower etch rates than materials 17 and 19 under the conditions utilized to remove materials 17 and 19. The layer of material 102 can be referred to as a support layer, in that it forms a support between adjacent containers (40, 42, 44 and 46) of material 30.

Referring to FIG. 24, material 102 is subjected to an anisotropic etch which transfers the pattern of gaps 34, 36 and 38 into the material 102. Such exposes oxide-containing material 17 through the gaps punched through material 102.

Referring to FIG. 25, oxide-containing material 17 is removed through the openings in material 102 with an isotropic etch, analogously to the processing discussed above with reference to FIG. 5. The structure of FIG. 25 can subsequently be utilized to form a number of capacitors with processing analogous to that discussed above with reference to FIG. 6.

Memory cells and other structures formed in accordance with methodology of the present invention can be incorporated into various electronic systems.

Figure 26:
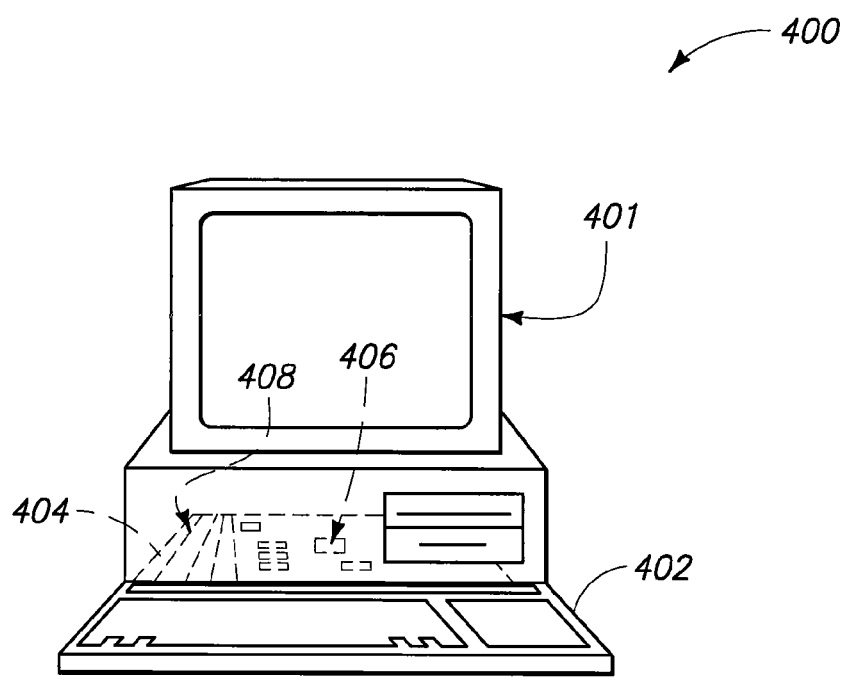
FIG. 26 is a diagrammatic view of a computer illustrating an exemplary application of the present invention.
Figure 27:
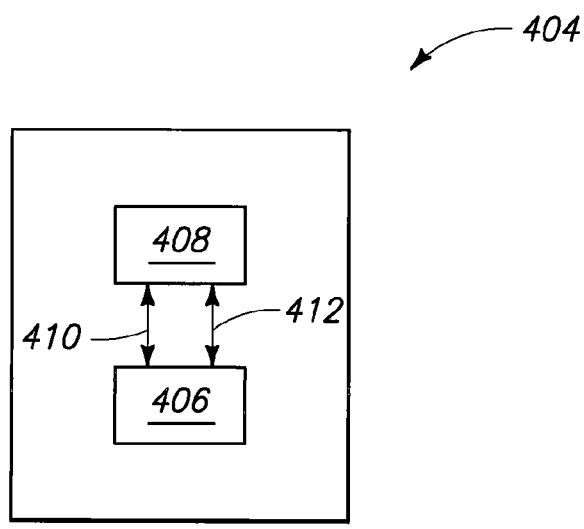
FIG. 27 is a block diagram showing particular features of the motherboard of the FIG. 26 computer.

FIG. 26 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 27. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

Figure 28:
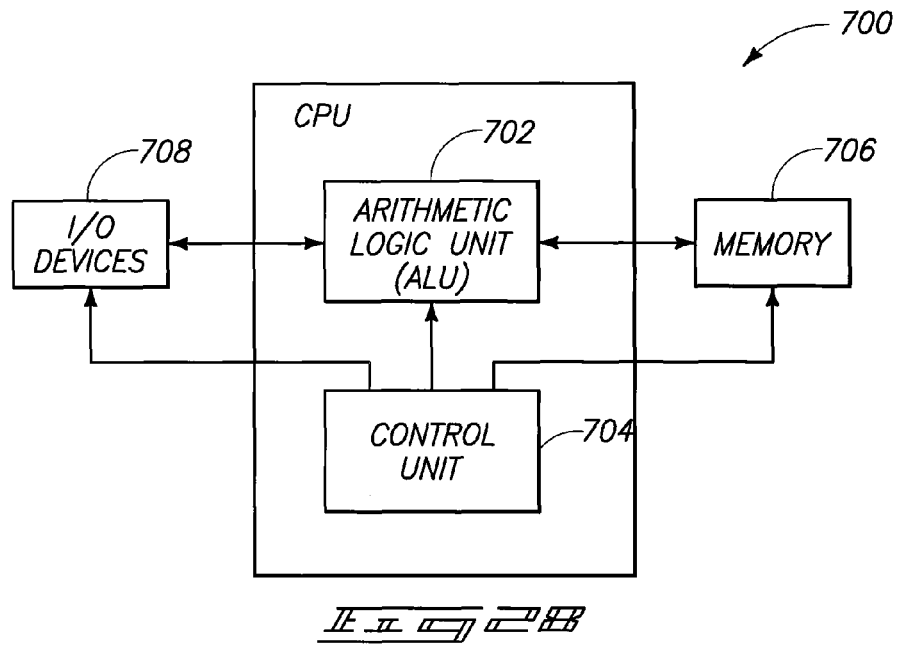
FIG. 28 is a high level block diagram of an electronic system according to an exemplary aspect of the present invention.

FIG. 28 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

Figure 29:
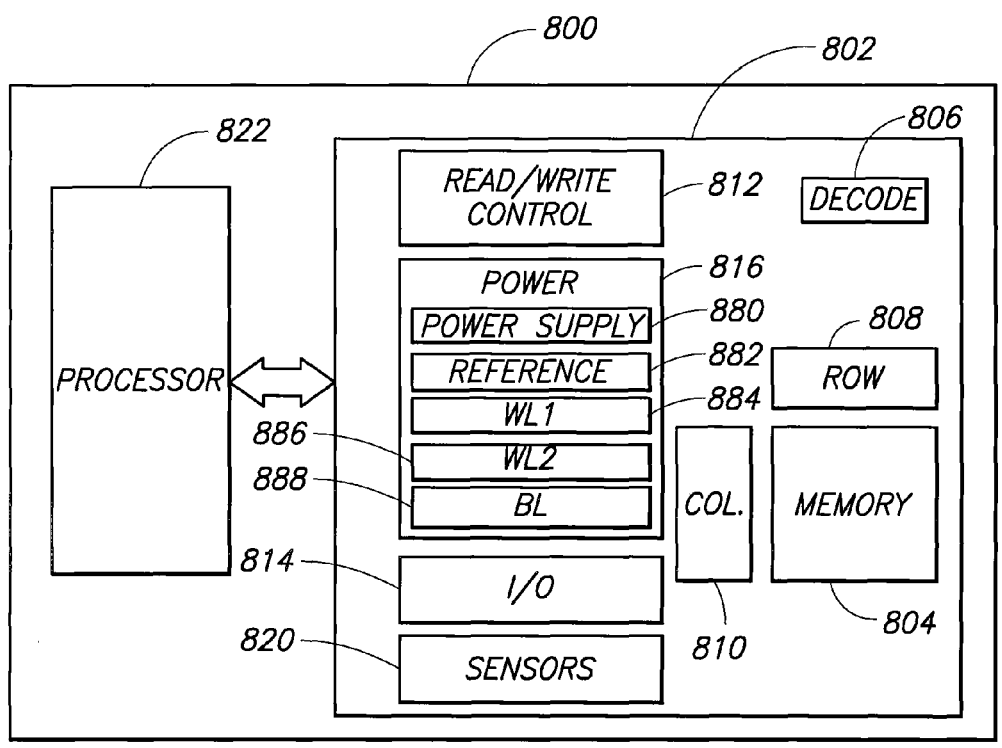
FIG. 29 is a simplified block diagram of an exemplary memory device according to an aspect of the present invention.

FIG. 29 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first word-line with pulses, circuitry 886 for providing the second word-line with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method for forming a semiconductor construction, comprising:
    providing a substrate which includes a semiconductor material base, a plurality of electrical nodes supported by the base, a plurality of upwardly-opening containers of conductive material extending upwardly from the nodes, and insulative material between the containers; the insulative material including, in ascending order from the base, a first silicon dioxide-containing layer, a first silicon nitride-containing layer, a second dioxide-containing layer, and a second silicon nitride-containing layer; the conductive material extending across the second silicon nitride-containing layer;
    forming sacrificial material across the conductive material and within the upwardly-opening containers;
    forming protective material over the sacrificial material within the containers, the protective material having gaps therethrough to expose the sacrificial material between the containers;
    extending the gaps through the sacrificial material, conductive material and second silicon nitride-containing layer to the second dioxide-containing layer;
    removing at least some of the second dioxide-containing layer to expose at least a portion of the first silicon nitride-containing layer;
    exposing the conductive material and first silicon nitride-containing layer to an etch which penetrates through the first silicon nitride-containing layer but does not remove at least the majority of the conductive material from the containers; the first dioxide-containing layer being exposed through the penetrated first silicon nitride-containing layer; and
    removing the exposed first dioxide-containing layer.

2. The method of claim 1 wherein the sacrificial material is a dielectric material.

3. The method of claim 1 wherein the sacrificial material consists of silicon dioxide, silicon nitride or silicon.

4. The method of claim 1 wherein the sacrificial material consists of silicon dioxide and is removed during removal of the first or second silicon dioxide-containing layers.

5. The method of claim 1 wherein the conductive material comprises metal.

6. The method of claim 1 wherein the conductive material comprises conductive metal oxide.

7. The method of claim 1 wherein the conductive material comprises conductively-doped semiconductor material.

8. The method of claim 1 wherein the conductive material comprises one or more of titanium nitride, tantalum nitride, aluminum nitride and hafnium nitride.

9. The method of claim 1 further comprising, after removal of the first dioxide-containing layer:
    forming capacitor dielectric material within the containers; and
    forming capacitor plate material over the capacitor dielectric material; the capacitor plate material, capacitor dielectric material and conductive material containers together being incorporated into a plurality of capacitors.

10. The method of claim 1 wherein the conductive material comprises Ti, W or Ru.

\* \* \* \* \*